United States Patent [19]

Boucard et al.

[11] Patent Number: 4,879,630
[45] Date of Patent: Nov. 7, 1989

[54] HOUSING FOR AN ELECTRONIC CIRCUIT

[75] Inventors: Michel Boucard, Tournefeuille; Christian Thirion, Auterive; Christian Maurel, Toulouse, all of France

[73] Assignee: Bendix Electronics S.A., Toulouse, France

[21] Appl. No.: 239,718

[22] Filed: Sep. 1, 1988

[30] Foreign Application Priority Data

Sep. 3, 1987 [FR] France ............... 87 12241

[51] Int. Cl.⁴ .............................. H05K 7/20
[52] U.S. Cl. ......................... 361/386; 174/16.3; 357/81; 361/394; 361/395; 361/413
[58] Field of Search .......... 174/16 HS; 357/81; 361/386–389, 394, 395, 396, 413

[56] References Cited

U.S. PATENT DOCUMENTS 3,972,062 7/1976 Hopp .
4,060,847 11/1977 Penrod ............................ 361/387
4,167,647 9/1979 Sal et al. ........................... 361/389
4,436,951 3/1984 Riet et al. ......................... 361/388
4,660,124 4/1987 Way ................................. 361/388

FOREIGN PATENT DOCUMENTS 0078684 5/1983 European Pat. Off. .
0113073 7/1984 European Pat. Off. .
0178977 4/1986 European Pat. Off. .
87/01007 2/1987 PCT Int'l Appl. .

Primary Examiner—Gregory D. Thompson
Attorney, Agent, or Firm—Russel C. Wells; George L. Boller

[57] ABSTRACT

The housing protects a circuit comprising active power components 10, 11, 12. A power electrode of the component 10 is welded onto the flush surface 15 of a radiator 13 accommodated in the base of the housing. The radiator is formed in one piece with an elongate part 14, the end 5 of which projects from the housing in the form of an external connecting pin. The radiator 13 may take various forms, including that of a grid.

9 Claims, 2 Drawing Sheets

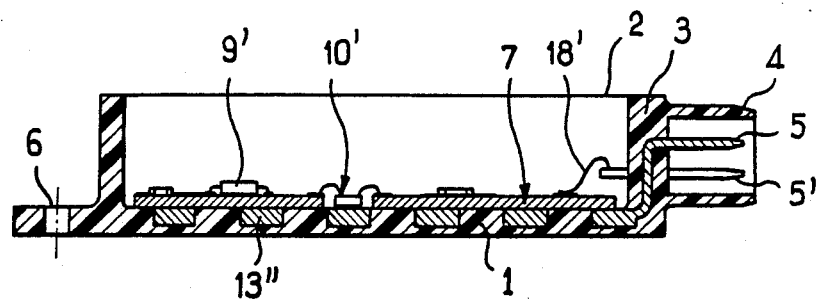
FIG_2
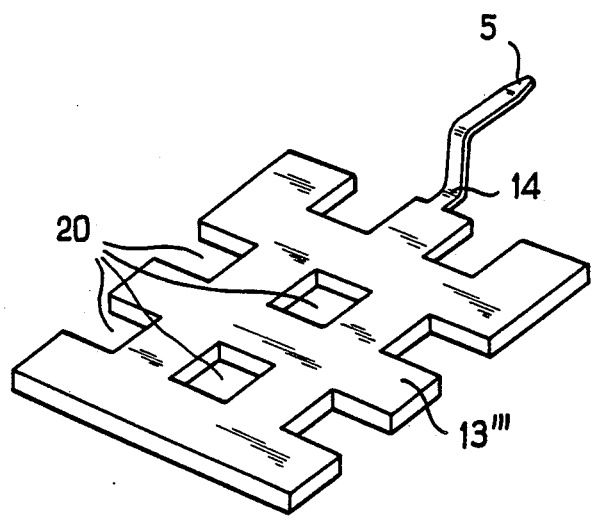
FIG_3

HOUSING FOR AN ELECTRONIC CIRCUIT

BACKGROUND AND SUMMARY

The present invention relates to a housing for an electronic circuit and, more particularly, to such a housing designed to receive at least one electronic power component.

In current practice nowadays, use is made of electronic devices comprising a part referred to as the "power" part in which electric currents of substantial intensity give rise, in the components through which they flow, to a liberation of heat such that it is necessary to provide means for removal of this thermal energy. The active components comprising electrodes through which these currents flow, such as the collector of a power transistor for example, are particularly sensitive to a rise of temperature, and it is necessary to ensure their cooling in order that their operating characteristics should not be effected thereby.

In order to do this, in current practice there is welded onto the collector of a power transistor a metal plate of larger surface, constructed of copper for example, in order to increase the thermal radiation, it being possible for this plate itself to be electrically connected to an external connecting pin by a wire welded at its two ends, or by a conductive track engraved or deposited and welds at the ends of this track. The plate itself may be fixed on a substrate, constructed of ceramic for example, which is electrically insulating but nevertheless of low thermal resistance, this substrate being itself in thermal contact with a heat sink. A description is given of a housing comprising such an arrangement of plates and of welds or linkages in French Pat. No. 2,570,877. European Application No. 78,684 and U.S. Pat. No. 3,972,062 describe other housings or mountings of power components in which an electrode is arranged in such a manner as to fulfil both a thermal function and an electrical function.

These known housings comprise a large number of welds or other linkages which make more difficult the thermal transfers which are necessary for the cooling of the power component, while complicating the mounting and thus diminishing its reliability. Furthermore, they are not adapted for the reception of more than one power component, or for the simultaneous reception of other active or passive components, as is, in current practice, now found in numerous electronic circuits such as circuits for the command of actuators comprising a computation section and a power section. By way of non-limiting example of applications of circuits of this type, it is possible to mention the command of an internal combustion engine ignition coil.

The object of the present invention is therefore to provide a housing for an electronic circuit comprising at least one power component, this housing being equipped with means for thermal and electrical functions ensuring, with a minimum number of welds or other linkages, the cooling of the component by means of one of its electrodes and the electrical linkage of this electrode to an external connecting pin of the housing.

The object of the present invention is also to provide such a housing designed to receive, besides power components associated with these means having a thermal and electronic function, other components which can be mounted in the traditional manner and connected to other external connecting pins of the housing.

These objects of the invention are achieved with a housing for an electronic circuit comprising at least one electronic power component, equipped with at least one radiator exhibiting a surface arranged to be in thermal and electrical contact with an electrode of the component, wherein said surface of the radiator is flush on a face of an internal wall of the housing, while the other faces of the radiator are embedded in this wall, and wherein an electrical connecting pin is formed in one piece with the radiator, this pin extending in the thickness of at least said wall of the housing, to emerge from the latter in an external connecting position.

By virtue of the radiator having a connecting pin integrated with the housing according to the invention, this radiator has imparted thereto a two-fold thermal and electrical function at the cost of a minimum number of welds or other linkages, as will be explained hereinbelow in association with the examination of the accompanying drawing, in which:

BRIEF DESCRIPTION OF THE DRAWINGS

FIG. 2 is a partial view, in cross-section, of another embodiment of the housing according to the invention 1 and FIG. 3 is a perspective view of a particular embodiment of a radiator having an integrated connecting pin designed to equip a housing according to the invention.

DESCRIPTION OF THE PREFERRED EMBODIMENTS

Figure 1:
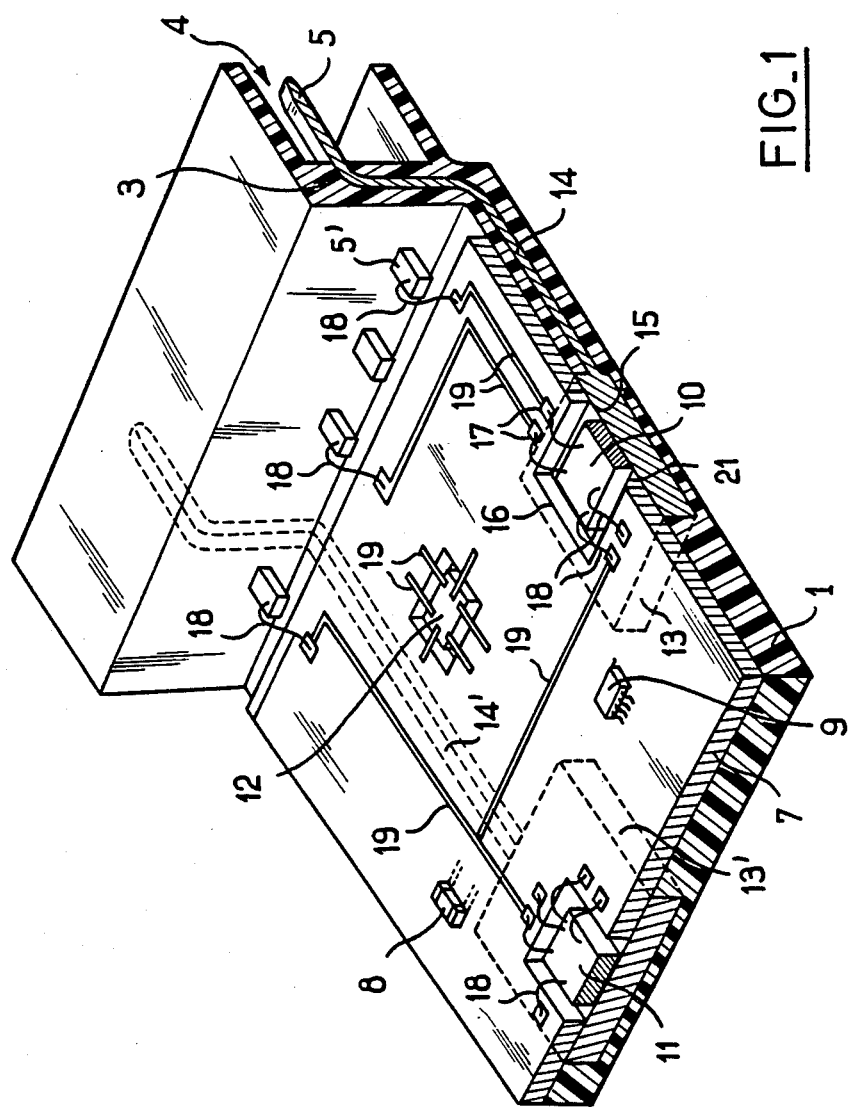
FIG. 1 is a partial view, in perspective and in cross-section, of a housing for an electronic circuit according to the invention.

Reference is made, first of all, to FIG. 1, which shows a part of the base 1 of the housing according to the invention, limited by two orthogonal cross-sectional planes, this base being of the same type as that of the housing represented more completely in FIG. 2. The same reference numeral, possibly indexed, designates in the figures elements or components which are identical or similar. The base 1 is hermetically sealed by a cover (not shown) which is fixed on an upper opening 2 of the base (see FIG. 2). From a lateral wall 3 of the base 1 projects a recess 4 designed to protect groups of electrical connecting pins 5, 5' arranged, for example, in two parallel lines. This recess is dimensioned in such a manner as to receive on a complementary basis a connector (not shown) which establishes a linkage between an electronic circuit contained within the housing and external apparatuses or components which exchange electrical signals with the circuit which it is the function of the housing to protect from possible degradations resulting from external influences (humidity, temperature, dust, etc.). Holes such as are represented as 6 (FIG. 2) are pierced in an extension of the base of the housing. These holes are intended to be traversed by fixing components such as screws, for the fixing of the housing on a support, in a position of use. All these arrangements are within current practice and will therefore not be described further on.

Again conventionally, a substrate 7 capable of receiving components of the electronic circuit is fixed on the base of the housing. This substrate may be constructed of aluminum or of ceramic, for example, and may exhibit a multi-layer structure with conductive layers and conductive tracks, as is well known.

Passive or active components of all types are mounted on this substrate in accordance with the particular organization of the circuit, with the objective of causing it to execute this or that particular function. The passive components may be resistors, capacitors or induction coils which are conventional or of the type for surface mounting, for example. The active components may consist of discrete or integrated components, in the form of baer chips or in housings of various known types. By way of example, there has been shown on the substrate of the circuit contained in the housing of FIG. 1 a resistor 8 for surface mounting and an integrated circuit 9,9′ in a housing for surface mounting. The circuit further comprises power components 10, 10′, 11, 12, the mounting of which takes advantage of the structure of the housing according to the invention, as is explained in greater detail hereinbelow.

The component diagrammatically represented at 10 in the form of a "chip" in FIG. 1 may be, by way of non-limiting example, an "intelligent" power component comprising a power electrode located at the lower face 21 of the component (from the point of view of FIG. 1). This electrode passes relatively high currents which generate a joule effect such that a removal of the liberated heat must be provided. Furthermore, the current must be transmitted to the exterior of the housing to a consumer apparatus such as an actuator commanded by this current.

In order to do this, the housing according to the present invention comprises a metallic radiator 13 formed in one piece with an elongate part 14 constituting a connecting pin 5, the end of which projects from the housing into the recess 4, the greater part of the elongate part 14 being embedded in the material constituting the base of the housing 1. The upper surface 15 of the radiator 13 is far larger than that of the electrode formed on the face 21 of the component 10, in order to offer to the calories a larger dissipation surface which increases the rate of removal of these calories.

According to a feature of the housing of the invention, this upper surface 15 is flush with the surface of the base of the housing. Moreover, it appears in FIG. 1 that the substrate 7 is cut out, opposite the radiator 13, with a window 16 which permits the mounting of the component 10 on the radiator. This mounting is effected by welding of the power electrode of the component 10 on the radiator 13, the zone of contact of the surface 15 of the radiator being previously metallized (with silver, for example) in order to facilitate the welding.

It is noted that there is thus only a single weld between this electrode and the associated connecting pin 5. This feature of the housing according to the invention affords several advantages. First of all, it accelerates the mounting of the component. It increases the reliability of the electrical connections, which decreases with the number of welds, which may possibly fail, of the housings of the prior art. It correlatively diminishes the prime costs of manufacture.

The flush arrangement of the radiator 13 on the base of the housing according to the invention facilitates the mounting within this housing of the circuit on substrate 7 and of the component 10 itself, by automatic machines used in the manufacture of electronic housings in large series, for the car industry for example.

In addition to the power electrode forming part of the component 10, other electrodes of this component which do not pose thermal problems may be connected in the circuit, or to the connecting pins 5′, by conventional means, contact pins 17, welded wires 18 and conductive tracks 19, as represented in FIG. 1 by way of example.

According to the invention, the housing may comprise a plurality of power components 10, 11, 12, each mounted on an associated radiator, as is the component 10. Incidentally, the connection between the tracks 19 of the substrate 7 and the electrodes of the component may be direct, as represented for the component 12 in FIG. 1. The arrangement of the various radiators 13, 13′, . . . embedded in the housing with the associated elongate parts 14, 14′, . . . must then form the subject of a particular study concerning space requirement and intelacing.

The base of the housing according to the invention may be preferably constructed by injection molding. More specifically, the radiators are then fixed against the base of a mold by means of retaining pins, in predetermined positions corresponding to those of the surfaces 15 of these radiators on the base of the housing to be obtained, and use is then made of the technique of double molding to fix the radiators in position and then to fill the sites occupied by retaining pins, after withdrawal of the latter.

Various thermoplastic or thermosetting materials can be used for the injections, at the choice of a person skilled in the art. It will, for example, by possible to choose the products sold under the names RYTON, VALOX 420, RINITE 530, marketed by the companies known as Phillips Petroleum, General Electric and Du Pont de Nemours, respectively.

The radiators incorporated in the housing according to the invention may take the form of a generally rectangular solid plate. However, this form may undergo various modifications with a view to adapting it to specific requirements. For example, if the surface of the radiator is to be relatively large, in order to ensure a good heat dissipation, it will be possible to impart to this radiator the configuration of a grid 13″, 13″′, as represented in FIGS. 2 and 3 respectively, in such a manner as to permit the injection of the material constituting the housing into apertures 20 of the grid (see FIG. 3). The good behavior of the radiator in the thickness of the housing is thus ensured, even with small thicknesses of material. The radiator having an integrated connecting pin of the housing according to the invention may thus ensure a function of mechanical behavior of the housing, by the metal reinforcement which it provides, in addition to its thermal and electrical functions which have been described hereinabove. The fixing of the radiator in the thickness of the housing may also be reinforced by indentations (not represented) which deform the radiator in its thickness.

The housing according to the invention is used for the protection of an electronic circuit comprising a power section requiring a cooling of certain components at the location of an electrode of these components. It lends itself to an automated manufacture in large numbers and also permits the automated insertion of the power components in the housing, as is required in the manufacture of internal combustion engine command circuits for the car industry, for example.

We claim:
1. A housing for an electronic circuit comprising:
at least one electronic power component;
at least one radiator means embedded in the housing and having one surface in thermal and electrical contact with an electrode of said component, said one surface being flush with an internal surface of the housing; and an electrical connecting pin integral with said radiator means, said pin embedded in the housing, said pin extending from the housing for forming an external connection.

2. The housing as claimed in claim 1, wherein the radiator means takes the form of a solid plate.

3. The housing as claimed in claim 1, wherein the radiator means takes the form of an apertured plate.

4. The housing as claimed in claim 1, wherein the material of the housing is a thermoplastic or thermosetting resin molded onto the radiator means in such a manner as to expose the surface of the radiator means which receives the power electrode of the electronic component.

5. A housing for an electronic circuit having at least one electronic power component, the housing comprising:

a base integral with wall means extending from said base, said base and said wall means being a molded member;

at least one radiator means embedded in said base and having a broadside surface flush with an internal surface of said base, said broadside surface in thermal and electrical contact with an electrode of the electronic power component; and an electrical connecting pin integral with said radiator means, said pin embedded in said molded member, said pin extending from said wall means to provide an external connection to the electrode of the electronic power component.

6. The housing as claimed in claim 5, wherein said broadside surface of said radiator means receiving said electrode of the electronic power component is metallized to facilitate the welding of said electrode to said broadside surface.

7. The housing as claimed in claim 3, additionally including a plurality of radiator means each having an electrical connecting pin embedded in said molded member an end of each said pins extending from said wall means in a predetermined order and pattern.

8. The housing as claimed in claim 5, additionally including a substrate attached to the internal surface of the base of said molded member and overlapping said broadside surface of said radiator means, said substrate exposing at least a part of said broadside surface for welding the electrode of said electronic power component, said substrate mounting active or passive components thereon and connection means for providing external connections to said active or passive components, said external connections extending from said wall means in a predetermined order and pattern with said electrical connecting pin.

9. The housing as claimed in claim 8, wherein the substrate is cut out with at least one window which receives said electronic power component connected in direct linkage to conductors formed on the uncovered face of the substrate.

* * * * *